(12) United States Patent
Miyasaka

(10) Patent No.: US 7,235,874 B2
(45) Date of Patent: Jun. 26, 2007

(54) SEMICONDUCTOR DEVICE, ITS MANUFACTURING METHOD, CIRCUIT BOARD, AND ELECTRONIC UNIT

(75) Inventor: Hideo Miyasaka, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 240 days.

(21) Appl. No.: 10/973,826

(22) Filed: Oct. 25, 2004

(65) Prior Publication Data
US 2005/0110141 A1 May 26, 2005

(30) Foreign Application Priority Data
Oct. 27, 2003 (JP) ............... 2003-366079

(51) Int. Cl.
*H01L 23/10* (2006.01)
*H01L 23/34* (2006.01)
*H01L 23/48* (2006.01)

(52) U.S. Cl. .............. 257/706; 257/778; 257/780; 257/712; 257/E23.101

(58) Field of Classification Search ................ 257/778, 257/738, 737, 780, 706, 712
See application file for complete search history.

(56) References Cited

U.S. PATENT DOCUMENTS

| | | | |
|---|---|---|---|
| 5,834,848 A * | 11/1998 | Iwasaki | 257/778 |
| 6,201,266 B1 * | 3/2001 | Ohuchi et al. | 257/106 |
| 6,563,712 B2 * | 5/2003 | Akram et al. | 361/719 |
| 6,611,055 B1 * | 8/2003 | Hashemi | 257/706 |
| 6,762,495 B1 * | 7/2004 | Reyes et al. | 257/737 |

FOREIGN PATENT DOCUMENTS

| | | |
|---|---|---|
| JP | 07-036451 | 2/1995 |
| JP | 09-055445 | 2/1997 |
| JP | 2000-022340 | 1/2000 |

* cited by examiner

*Primary Examiner*—Nitin Parekh
(74) *Attorney, Agent, or Firm*—Hogan & Hartson LLP

(57) ABSTRACT

A semiconductor device includes an interposer having first and second faces pointing in opposite directions to each other and a metallization pattern formed on the first face, and a semiconductor chip mounted on the first face of the interposer and having an electrode electrically connected with the metallization pattern. The interposer has a spacer formed within an overlapping region of the second face which the semiconductor chip overlaps and a land formed out of the overlapping region of the second face which the semiconductor chip overlaps. The spacer is formed so as not to be electrically connected with the metallization pattern, and the land is electrically connected with the metallization pattern.

9 Claims, 4 Drawing Sheets

SEMICONDUCTOR DEVICE, ITS MANUFACTURING METHOD, CIRCUIT BOARD, AND ELECTRONIC UNIT

BACKGROUND OF THE INVENTION

1. Field of the Invention

The present invention relates to a semiconductor device and its manufacturing method, a circuit board, and an electronic unit.

2. Description of Related Art

A Ball Grid Array (BGA) is known as a semiconductor device package, in which a number of solder balls are provided on its interposer. In order to provide such solder balls, lands are formed on the interposer. In the FAN-OUT type package, which is a form of the BGAs, solder balls are provided not within a region which a semiconductor chip overlaps but only outside the region. In this form, lands are provided not within the region which the semiconductor chip overlaps but only outside the region. Hence, the interposer was sometimes deflected because it wasn't supported under a semiconductor chip when the semiconductor chip was mounted on the interposer. Large deflections of the interposer can break the metallization pattern. Therefore, it is required to prevent such breaking.

An advantage of the present invention is to prevent a metallization pattern from being broken.

SUMMARY OF THE INVENTION

A semiconductor device according to an embodiment of the present invention includes an interposer having first and second faces pointing in opposite directions to each other and a metallization pattern formed on the first face. A semiconductor chip is mounted on the first face of the interposer and has an electrode electrically connected with the metallization pattern. The interposer has a spacer formed within an overlapping region of the second face which the semiconductor chip overlaps and a land formed out of the overlapping region of the second face which the semiconductor chip overlaps. The spacer is formed so as not to be electrically connected with the metallization pattern and the land is electrically connected with the metallization pattern.

According to an embodiment of the present invention, the spacer is formed within the overlapping region of the second face of the interposer which the semiconductor chip overlaps and as such, the spacer supports the interposer. As a result, the interposer becomes hard to deflect, which makes possible to prevent the metallization pattern from being broken.

In the semiconductor device, the semiconductor chip may be bonded to the interposer with its face down so that the electrode is opposed to the metallization pattern, and the spacer may be formed so as to overlap the electrode. The semiconductor chip may have a plurality of the above-described electrodes and the spacer may be formed so as to have continuous portions which overlap all of the electrodes.

According to an embodiment of the present invention, the spacer may be formed in a solid pattern so as to overlap an entire region within which all the electrodes are enclosed without leaving unoverlapped space in the region. In the semiconductor device, the spacer may be formed in a mesh-like form so as to overlap an entire region within which all the electrodes are enclosed. Also, the spacer may be divided into a plurality of portions.

The interposer may further have a resin layer formed on the second face so as to have an opening for exposing at least a part of the land, and the resin layer may be formed so as to have an opening for exposing at least a part of the spacer further. The resin layer may be formed so as to cover the spacer completely and the spacer and land may be formed from an identical material.

A circuit board according to an embodiment of the present invention includes the semiconductor device described above mounted thereon. An electronic unit according to an embodiment of the present invention includes the semiconductor device described above.

A method of manufacturing a semiconductor device according to an embodiment of the present invention includes placing an interposer, having first and second faces pointing in opposite directions to each other and a metallization pattern formed on the first face, on a base with the second face down and bonding a semiconductor chip having electrodes to the first face of the interposer with its face down so that the electrodes are opposed to the metallization pattern. The interposer has a spacer formed within an overlapping region of the second face which the semiconductor chip overlaps and a land formed out of the overlapping region of the second face which the semiconductor chip overlaps. The spacer is formed so as not to be electrically connected with the metallization pattern and the land is electrically connected with the metallization pattern.

According to an embodiment of the present invention, the spacer is formed within the overlapping region of the second face of the interposer which the semiconductor chip overlaps and as such, the spacer supports the interposer. As a result, the interposer becomes hard to deflect, which makes possible to prevent the metallization pattern from being broken.

DETAILED DESCRIPTION OF THE PREFERRED EMBODIMENTS

The embodiments of the invention will be described below in reference to the drawings.

Figure 1:
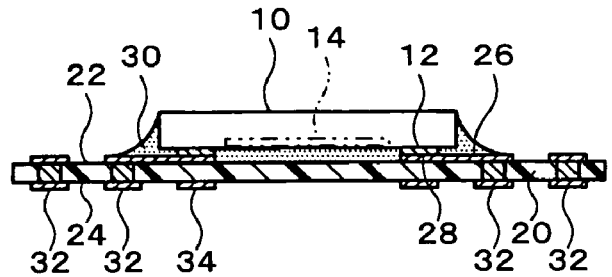
FIG. 1 is a cross-sectional view of assistance in explaining a semiconductor device according to an embodiment of the present invention, which is taken along the line I—I of the semiconductor device shown in FIG. 2.
Figure 2:
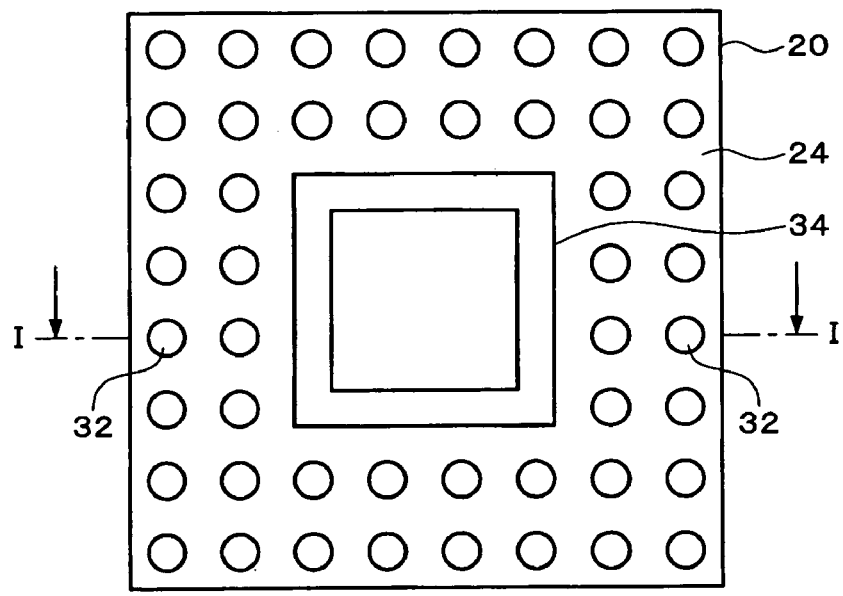
FIG. 2 is a bottom view of the semiconductor device according to an embodiment of the present invention.

FIGS. 1 and 2 are illustrations in connection with an embodiment of the present invention. Of those, FIG. 2 is a bottom view of a semiconductor device and FIG. 1 is a cross-sectional view of the semiconductor device taken along the line I—I shown in FIG. 2.

The semiconductor device has a semiconductor chip 10. The semiconductor chip 10 has one or more electrodes 12. (The number of electrodes is two or more in the case of the example illustrated by FIG. 1). Each of the electrodes 12 may include a pad and a bump thereon. The electrode 12 is arranged in an end portion of the semiconductor chip 10. (When the semiconductor chip 10 has a rectangular shape, electrodes are arranged in both end portions along two opposed sides thereof or peripheral end portions along four sides thereof) The electrode 12 is electrically connected with an inside portion of the semiconductor chip 10. An integrated circuit 14 is built in the semiconductor chip 10 (e.g., in the surface where the electrode 12 is formed). All or some of the electrodes 12 are electrically connected with the integrated circuit 14.

The semiconductor device has an interposer 20. The interposer 20 can be also referred to as a substrate or film. The interposer 20 is made from a resin such as polyimide. The interposer 20 has first and second faces 22 and 24 pointing in opposite directions to each other. On the first face 22, a metallization pattern 26 is formed. The metallization pattern 26 may include a pad (a portion of a width larger than the metallization line width) 28.

The semiconductor chip 10 is mounted on the interposer 20 (on the first face 22 thereof). The face of the semiconductor chip 10 on which the electrode 12 is formed is opposed to the interposer 20. In other words, the semiconductor chip 10 is bonded to the interposer 20 with its face down. The electrode 12 is opposed to the metallization pattern 26 (e.g., a pad 28 thereof). While a portion (e.g., a portion including the pad 28) of the metallization pattern 26 may be disposed under the semiconductor chip 10, the remaining portion may be located laterally outside the semiconductor chip 10.

The semiconductor chip 10 may be glued on the interposer 20 by an adhesive 30. A portion of the adhesive 30 may be located between the semiconductor chip 10 and the interposer 20. A portion of the adhesive 30 may be attached on a side surface of the semiconductor chip 10.

The electrode 12 is electrically connected with the metallization pattern 26. For such electrical connection, intermetallic joining may be conducted between the metallization pattern 26 and the electrode 12 (for example, at the pad 28 thereof). When the adhesive 30 is an anisotropically conductive material (such as an anisotropically conductive film, or anisotropically conductive paste) containing electroconductive particles, the electroconductive particles may be interposed between the electrode 12 and the metallization pattern 26 to electrically connect them.

On the second face 24 of the interposer 20, a land 32 is formed out of an overlapping region which the semiconductor chip 10 overlaps. The land 32 is formed with a conductive material such as copper, and it may be formed with the same material as that of the metallization pattern 26. The land 32 is electrically connected with the metallization pattern 26 through a through-hole, etc.

On the second face 24 of the interposer 20, a spacer 34 is formed within an overlapping region which the semiconductor chip 10 overlaps. The spacer 34 may be formed so as to overlap the electrode 12 (or pad 28). Also, the spacer 34 may be formed so as to have continuous portions which overlap all of the electrodes 12 (or pads 28). For example, the spacer 34 is shaped into a ring in the example illustrated by FIG. 2. The spacer 34 is disposed out of a region which a central portion of the semiconductor chip 10 overlaps.

The spacer 34 may be formed so as not to be electrically connected with the metallization pattern 26. The spacer 34 may be formed with the same material as that of the land 32, or it may be formed with a material different from that of the land 32 (e.g. a resin). The spacer 34 may be of the same thickness as that of the land 32, or may be formed with a thickness thinner or thicker than that of the land 32.

According to an embodiment of the present invention, the spacer 34 is formed within the overlapping region of the second face 24 of the interposer 20 which the semiconductor chip 10 overlaps and as such, the spacer 34 supports the interposer 20. As a result, the interposer 20 becomes hard to deflect, which makes possible to prevent the metallization pattern 26 from being broken.

Figure 3:
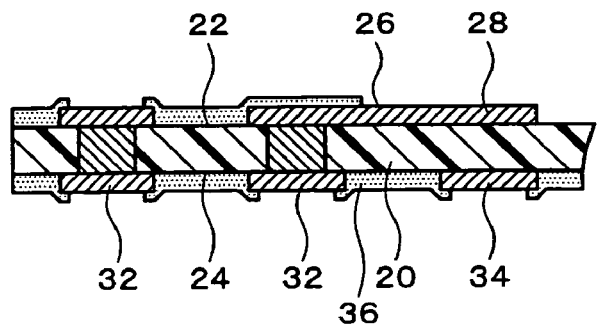
FIG. 3 is a view of assistance in explaining an alternative of the interposer according to an embodiment of the present invention.
Figure 4:
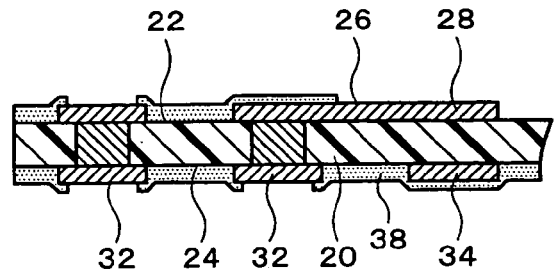
FIG. 4 is a view of assistance in explaining an alternative of the interposer according to an embodiment of the present invention.

FIGS. 3 and 4 are each views for assistance in explaining an alternative of the interposer. As shown in FIG. 3, a resin layer (e.g., solder resist layer) 36 may be formed on the second face of the interposer 20. The resin layer 36 is formed so as to have an opening for exposing at least a part of the land 32. Further, the resin layer 36 may have an opening for exposing at least a part of the spacer 34. As an alternative of the resin layer 36, a resin layer 38 may be formed so as to cover the spacer 34 completely as shown in FIG. 4. In the case the spacer 34 can be electrically isolated from the outside and as such, the spacer 34 may be electrically connected with the metallization pattern 26.

Figure 5:
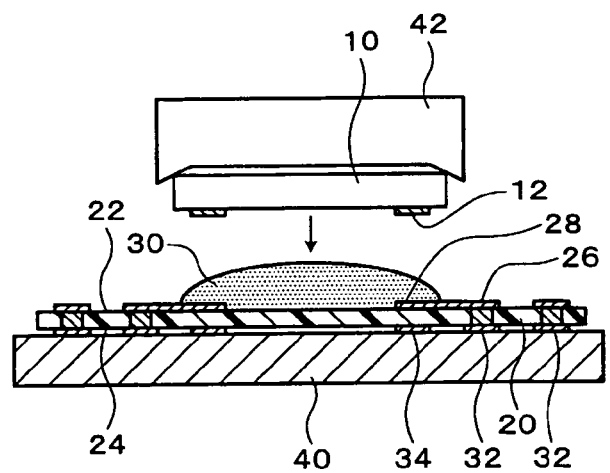
FIG. 5 is a view of assistance in explaining a method of manufacturing a semiconductor device according to an embodiment of the present invention.

FIG. 5 is a view of assistance in explaining a method of manufacturing a semiconductor device according to an embodiment of the present invention. In this embodiment, the interposer 20 is placed on the base 40 with its second face 24 down. The configuration of the interposer 20 is as described above. For example, a spacer 34 is formed within an overlapping region of the second face 24 of the interposer 20 which the semiconductor chip 10 overlaps.

The base 40 may be one which has a heater (not shown) and which is capable of heating the interposer 20 (metallization pattern 26). An adhesive 30 may be disposed on the first face 22 of the interposer 20. While the adhesive 30 shown in FIG. 5 is in the form of a paste form, it may be in the form of a sheet (or a film).

A semiconductor chip 10 having electrodes 12 is bonded to the first face 22 of the interposer 20 with its face down so that the electrodes 12 are opposed to the metallization pattern 26. More specifically, the semiconductor chip 10 is pressed into contact with the interposer 20 using a bonding tool 42. Incidentally, the bonding tool 42 may be one which has a heater (not shown) and which is capable of heating the semiconductor chip 10.

When the semiconductor chip 10 is subjected to pressure, a force is applied to the interposer 20, for example, through the electrodes 12 and pads 28. However, the interposer 20 is supported on the base 40 through the spacer 34 in this embodiment. As a result, the interposer 20 becomes hard to deflect, which makes possible to prevent the metallization pattern 26 from being broken.

In this embodiment, the spacer 34 is disposed out of a region which a central portion of the semiconductor chip 10 overlaps. Therefore, even when the portion of the interposer 20 which the central portion of the semiconductor chip 10 overlaps deflects, for example, through the adhesive 30 so that the second face 24 is protrudent, it is hard to cause a deflection such that the first face 22 protrudes. This makes possible to prevent the contact between the interposer 20 (and especially the metallization pattern 26 thereon) and the semiconductor chip 10.

Figure 6:
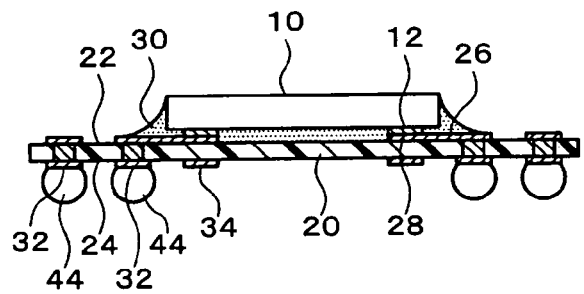
FIG. 6 is a view of assistance in explaining a semiconductor device according to an embodiment of the present invention and its manufacturing method.

The method of manufacturing the semiconductor device includes what can be derived from the details of the above-described semiconductor device. In addition, as shown in FIG. 6, a solder ball 44 may be provided on the land 32, with the proviso that the solder ball 44 is not provided on the spacer 34. The semiconductor device in connection with an embodiment of the present invention may have a solder ball 44.

Figure 7:
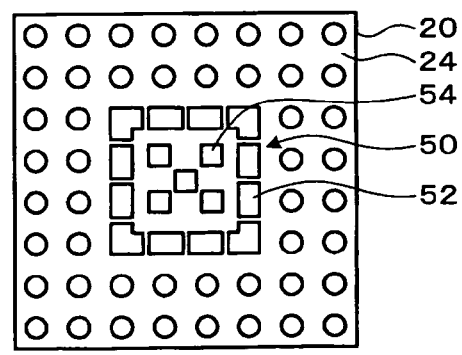
FIG. 7 is a view of assistance in explaining an alternative of the spacer formed on the interposer according to an embodiment of the present invention.
Figure 8:
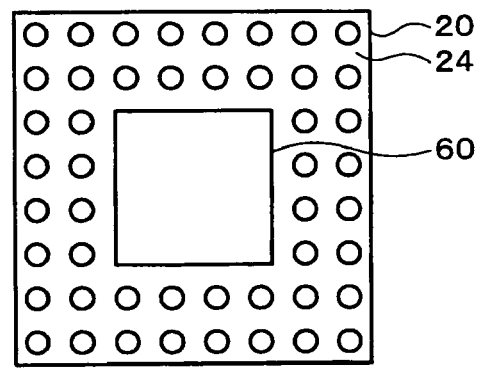
FIG. 8 is a view of assistance in explaining an alternative of the spacer formed on the interposer according to an embodiment of the present invention.
Figure 9:
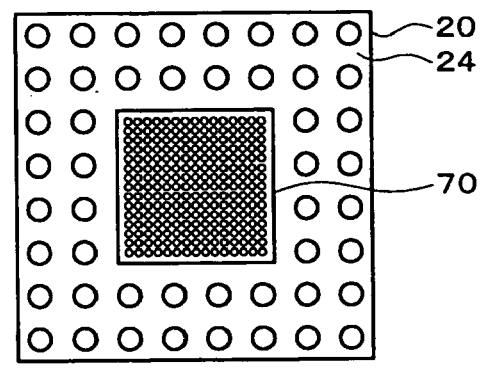
FIG. 9 is a view of assistance in explaining an alternative of the spacer formed on the interposer according to an embodiment of the present invention.

FIGS. 7 to 9 are views of assistance in explaining alternatives of the spacer formed on the interposer.

The spacer 50 shown in FIG. 7 is divided into a plurality of portions. The spacer 50 includes two or more first portions 52 which overlap the electrodes 12 of the semiconductor chip 10 shown in FIG. 1, for example. The first portions 52 are in an arrangement resulting from the division of the spacer 34 shown in FIG. 2. The spacer 50 includes one or more second portions 54 inside the first portions 52. The second portions 54 are disposed in a region to which the central portion of the semiconductor chip 10 overlaps. Therefore, it is possible to prevent a portion of the interposer 20 to which the central portion of the semiconductor chip 10 overlaps from being bent in the manner that the second face 24 is protrudent. In addition, because an exposed surface is discontinuously exposed from the spacer 50 on the interposer 20, when the resin layer 36 or 38 shown in FIG. 3 or 4 is formed, the resin layers 36, 38 can be brought into close contact with the interposer 20. In this way, it becomes possible to prevent the resin layers 36, 38 from being exfoliated. The other details are the same as those that have been described in the foregoing embodiment.

The spacer 60 shown in FIG. 8 is formed in a solid pattern so as to overlap an entire region within which all the electrodes 12 shown in FIG. 1 are enclosed without leaving an unoverlapped space in the region. This makes it possible to prevent the interposer 20 from absorbing moisture because a wide range of the interposer 20 is covered with the spacer 60. Moreover, it is possible to prevent a portion of the interposer 20 which the central portion of the semiconductor chip 10 overlaps from being deflected so that the second face 24 is protrudent. The other details are the same as those that have been described in the foregoing embodiment.

The spacer 70 shown in FIG. 9 is formed in a mesh-like form so as to overlap with an entire region within which all the electrodes 12 shown in FIG. 1 are enclosed. This makes it possible to prevent a portion of the interposer 20 which the central portion of the semiconductor chip 10 overlaps from being bent in the manner that the second face 24 is protrudent. Furthermore, because an exposed surface is discontinuously exposed from the spacer 70 on the interposer 20, when the resin layer 36 or 38 shown in FIG. 3 or 4 is formed, the resin layers 36, 38 can be brought into close contact with the interposer 20. In this way, it becomes possible to prevent the resin layers 36, 38 from being exfoliated. The other details are the same as those that have been described in the foregoing embodiment.

Figure 10:
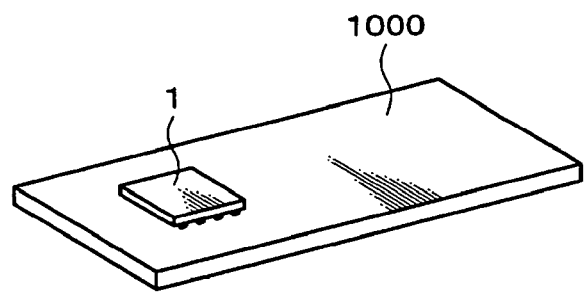
FIG. 10 is a view showing a circuit board with the semiconductor device according to an embodiment of the present invention.
Figure 11:
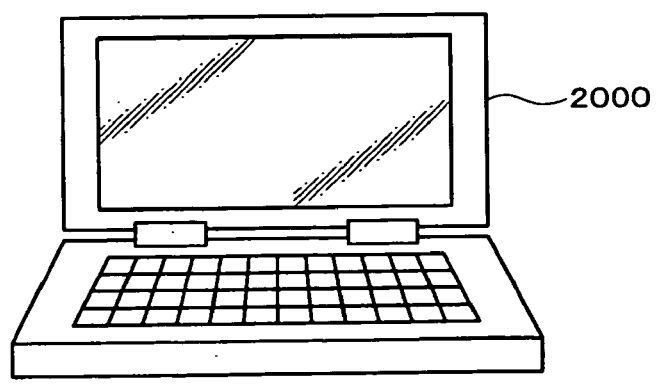
FIG. 11 is a view showing an electronic unit having the semiconductor device according to an embodiment of the present invention.
Figure 12:
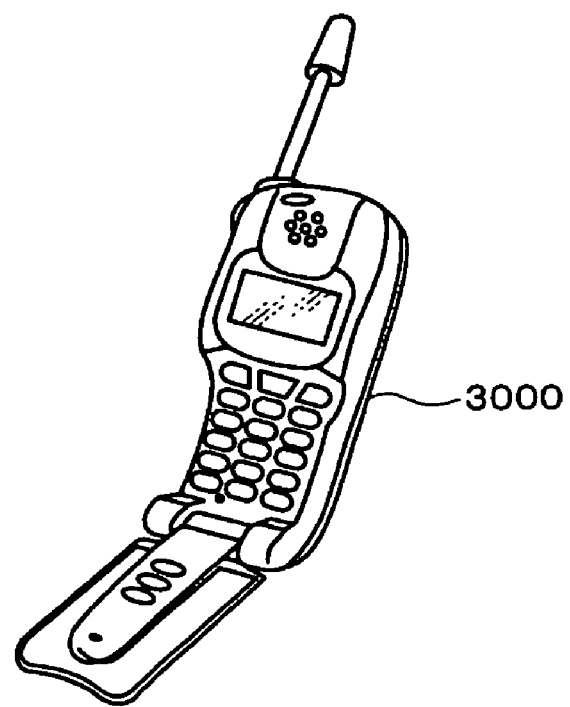
FIG. 12 is a view showing an electronic unit having the semiconductor device according to an embodiment of the present invention.

Referring to FIG. 10, there is shown a circuit board 1000 with the semiconductor device 1 described in the above embodiment. As an electronic unit having the semiconductor device, FIG. 11 shows a notebook-sized personal computer 2000 and FIG. 12 shows a cellular phone 3000.

The invention is not limited to the above-described embodiments and various modifications and changes may be made. For example, the invention may include an arrangement substantially identical to the arrangement described in any one of the embodiments (e.g., an arrangement identical in its function, method, and result, or an arrangement identical in its advantage and result). Also, the invention may include an arrangement wherein a nonessential part of the arrangement described in any one of the embodiments is replaced with another one. Further, the invention may include an arrangement which can produce the same effect and advantage as the arrangement described in any one of the embodiments can do or an arrangement which can achieve the same advantage. Still further, the invention may include an arrangement obtained by adding the well-known art to the arrangement which has been described in any one of the embodiments. Moreover, the invention may include details from which any of technical respects described in the above embodiments is exclusively removed. Or, the invention may include details in which the known art is excluded from the embodiments described above.

What is claimed is:

1. A semiconductor device, comprising:
    an interposer having first and second faces pointing in opposite directions to each other and a metallization pattern formed on the first face; and
    a semiconductor chip mounted on the first face of the interposer and having an electrode electrically connected with the metallization pattern,
    the interposer having a spacer formed within an overlapping region of the second face which the semiconductor chip overlaps and a land formed out of the overlapping region of the second face which the semiconductor chip overlaps,
    the spacer formed so as not to be electrically connected with the metallization pattern, and
    the land electrically connected with the metallization pattern,
    wherein the interposer further has a resin layer formed on the second face so as to have an opening for exposing at least a part of the land, and
    wherein the resin layer is formed so as to completely cover the spacer.

2. The semiconductor device of claim 1, wherein the semiconductor chip is bonded to the interposer face down so that the electrode is opposed to the metallization pattern, and the spacer is formed so as to overlap the electrode.

3. The semiconductor device of claim 2, wherein the semiconductor chip has a plurality of electrodes, and the spacer is formed so as to have continuous portions which overlap all of the electrodes.

4. The semiconductor device of claim 3, wherein the spacer is formed in a solid pattern so as to overlap an entire region within which all the electrodes are enclosed without leaving unoverlapped spaces in the region.

5. The semiconductor device of claim 3, wherein the spacer is formed in a mesh-like form so as to overlap an entire region within which all the electrodes are enclosed.

6. The semiconductor device of claim 1, wherein the spacer is divided into a plurality of portions.

7. A circuit board comprising the semiconductor device of claim 1 mounted thereon.

8. An electronic unit comprising the semiconductor device of claim 1.

9. A semiconductor device, comprising:

an interposer having first and second faces pointing in opposite directions to each other and a metallization pattern formed on the first face; and a semiconductor chip mounted on the first face of the interposer and having a means for electrically connecting with the metallization pattern, the interposer having a spacer formed within an overlapping region of the second face which the semiconductor chip overlaps and a land formed out of the overlapping region of the second face which the semiconductor chip overlaps, the spacer formed so as not to be electrically connected with the metallization pattern, and the land electrically connected with the metallization pattern, wherein the interposer further has a resin layer formed on the second face so as to have an opening for exposing at least a part of the land, and wherein the resin layer is formed so as to completely cover the spacer.

* * * * *